United States Patent
Philpott et al.

(10) Patent No.: US 11,258,409 B2
(45) Date of Patent: Feb. 22, 2022

(54) HIGH VOLTAGE SWITCH WITH FAST TURN-OFF

(71) Applicant: QUALCOMM Incorporated, San Diego, CA (US)

(72) Inventors: Justin Philpott, San Francisco, CA (US); Xiaocheng Jing, San Jose, CA (US); Jingxue Lu, San Diego, CA (US); Iulian Mirea, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/929,353

(22) Filed: Jul. 15, 2020

(65) Prior Publication Data

US 2022/0021348 A1   Jan. 20, 2022

(51) Int. Cl.
| | | |
|---|---|---|
| H03F 3/04 | (2006.01) | |
| H03F 1/30 | (2006.01) | |
| H04B 1/04 | (2006.01) | |
| H04B 1/16 | (2006.01) | |
| H03F 1/02 | (2006.01) | |

(52) U.S. Cl.
CPC ............... *H03F 1/305* (2013.01); *H04B 1/04* (2013.01); *H04B 1/1615* (2013.01); *H03F 1/0211* (2013.01); *H03F 1/0244* (2013.01); *H03F 2200/411* (2013.01); *H04B 2001/0408* (2013.01)

(58) Field of Classification Search
CPC ...... H03F 1/305; H03F 2200/411; H03F 3/04; H03F 1/0244; H03F 1/0211; H03F 2200/504; H03F 1/0227; H04B 1/04; H04B 1/1615; H04B 2001/0408; H03G 3/3042; H03G 3/004
USPC .................................................. 330/127, 297
See application file for complete search history.

(56) References Cited

U.S. PATENT DOCUMENTS

| | | | | |
|---|---|---|---|---|
| 8,519,788 | B2 * | 8/2013 | Khlat ...................... | H02M 3/07 330/127 |
| 9,041,364 | B2 * | 5/2015 | Khlat ....................... | H03F 3/24 323/268 |
| 9,280,163 | B2 * | 3/2016 | Kay ...................... | H04B 15/005 |
| 2014/0315504 | A1 * | 10/2014 | Sakai ..................... | H02M 3/156 455/127.2 |
| 2020/0381996 | A1 * | 12/2020 | Khlat ...................... | H03F 3/19 |

* cited by examiner

*Primary Examiner* — Khanh V Nguyen
(74) *Attorney, Agent, or Firm* — Patterson + Sheridan LLP

(57) ABSTRACT

Aspects of the present disclosure provide a high voltage switch with a fast turn-off. An example power supply circuit generally includes a capacitive element for coupling to a power terminal of an amplifier, a first switch configured to be closed in a first mode and to be open in a second mode, a second switch coupled in series between the first switch and the capacitive element and configured to be closed in the first mode and to be open in the second mode, a first circuit coupled to the first switch and configured to charge the capacitive element and power the amplifier in the first mode, and a buffer circuit having an output coupled to a first node and configured to output a first voltage level greater than half of a second voltage level at a second node.

20 Claims, 8 Drawing Sheets

HIGH VOLTAGE SWITCH WITH FAST TURN-OFF

BACKGROUND

Field of the Disclosure

Certain aspects of the present disclosure generally relate to electronic circuits and, more particularly, to a high voltage switch with a fast turn-off.

Description of Related Art

Integrated circuits (IC) are often powered using various power supply circuits such as a power supply that provides a constant output voltage or a switched-mode power supply (SMPS) that provides a variable voltage. The variable voltage output by the SMPS may facilitate efficient operation of an IC in terms of power consumption. The voltage may be adjusted using various techniques including average power tracking (APT), continuous envelope tracking (CET), or discrete envelope tracking (DET).

In certain cases, a wireless communication device may include a radio frequency (RF) transceiver (also referred to as a radio frequency front-end) for transmitting and/or receiving RF signals. On the transmit side, the RF transceiver may include an SMPS that supplies power to a power amplifier for amplifying the RF signals before transmission. Wireless communication devices are widely deployed to provide various communication services such as telephony, video, data, messaging, broadcasts, and so on. Such wireless communication devices may transmit and/or receive RF signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., Wi-Fi), and the like.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include a relatively fast turn-off scheme for a switch coupled to a capacitive element charged at a high voltage.

Certain aspects of the present disclosure provide a method of selectively powering a first amplifier. The method generally includes charging a capacitive element from a first circuit in a first mode for powering the first amplifier, the first circuit being coupled to a first switch coupled in series with a second switch and the capacitive element. The method further includes changing to a second mode for powering the first amplifier, opening the first switch for the second mode, and opening the second switch for the second mode. The method also includes coupling a first node between the first switch and the second switch to a first voltage level, where the first voltage level is less than a sum of a maximum drain-to-source voltage of the second switch and a voltage of the capacitive element after the charging; greater than a difference between a second voltage level at a second node between the first circuit and the first switch and a maximum drain-to-source voltage of the first switch; greater than a first control voltage for the first switch after opening the first switch; and less than a sum of a maximum drain-to-gate voltage of the second switch and a second control voltage for the second switch after opening the second switch.

Certain aspects of the present disclosure provide a power supply circuit. The power supply circuit generally includes a capacitive element, a first switch, a second switch, a first circuit, and a first buffer circuit. The capacitive element is for coupling to at least one power terminal of a first amplifier. The first switch is configured to be closed in a first mode and to be open in a second mode, and the second switch is coupled in series between the first switch and the capacitive element and configured to be closed in the first mode and to be open in the second mode. The first circuit is coupled to the first switch and configured to charge the capacitive element and power the first amplifier in the first mode. The first buffer circuit has an output coupled to a first node between the first switch and the second switch and is configured to output a first voltage level, where the first voltage level is less than a sum of a maximum drain-to-source voltage of the second switch and a voltage of the capacitive element after the charging; greater than a difference between a second voltage level at a second node between the first circuit and the first switch and a maximum drain-to-source voltage of the first switch; greater than a first control voltage for the first switch after opening the first switch; and less than a sum of a maximum drain-to-gate voltage of the second switch and a second control voltage for the second switch after opening the second switch.

Certain aspects of the present disclosure provide an apparatus for selectively powering an amplifier. The apparatus generally includes means for powering the amplifier in a first mode and means for selectively coupling a capacitive element to the means for powering the amplifier in the first mode, the means for selectively coupling comprising a first switch coupled in series with a second switch. The apparatus further includes means for changing to a second mode for powering the amplifier, means for controlling the first switch such that the first switch is closed in the first mode and open in the second mode, and means for controlling the second switch such that the second switch is closed in the first mode and open in the second mode. The apparatus also includes means for coupling a first node between the first switch and the second switch to a first voltage level greater, where the first voltage level is less than a sum of a maximum drain-to-source voltage of the second switch and a voltage of the capacitive element after charging; greater than a difference between a second voltage level at a second node between the means for powering the amplifier and the first switch and a maximum drain-to-source voltage of the first switch; greater than a first control voltage for the first switch after opening the first switch; and less than a sum of a maximum drain-to-gate voltage of the second switch and a second control voltage for the second switch after opening the second switch.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
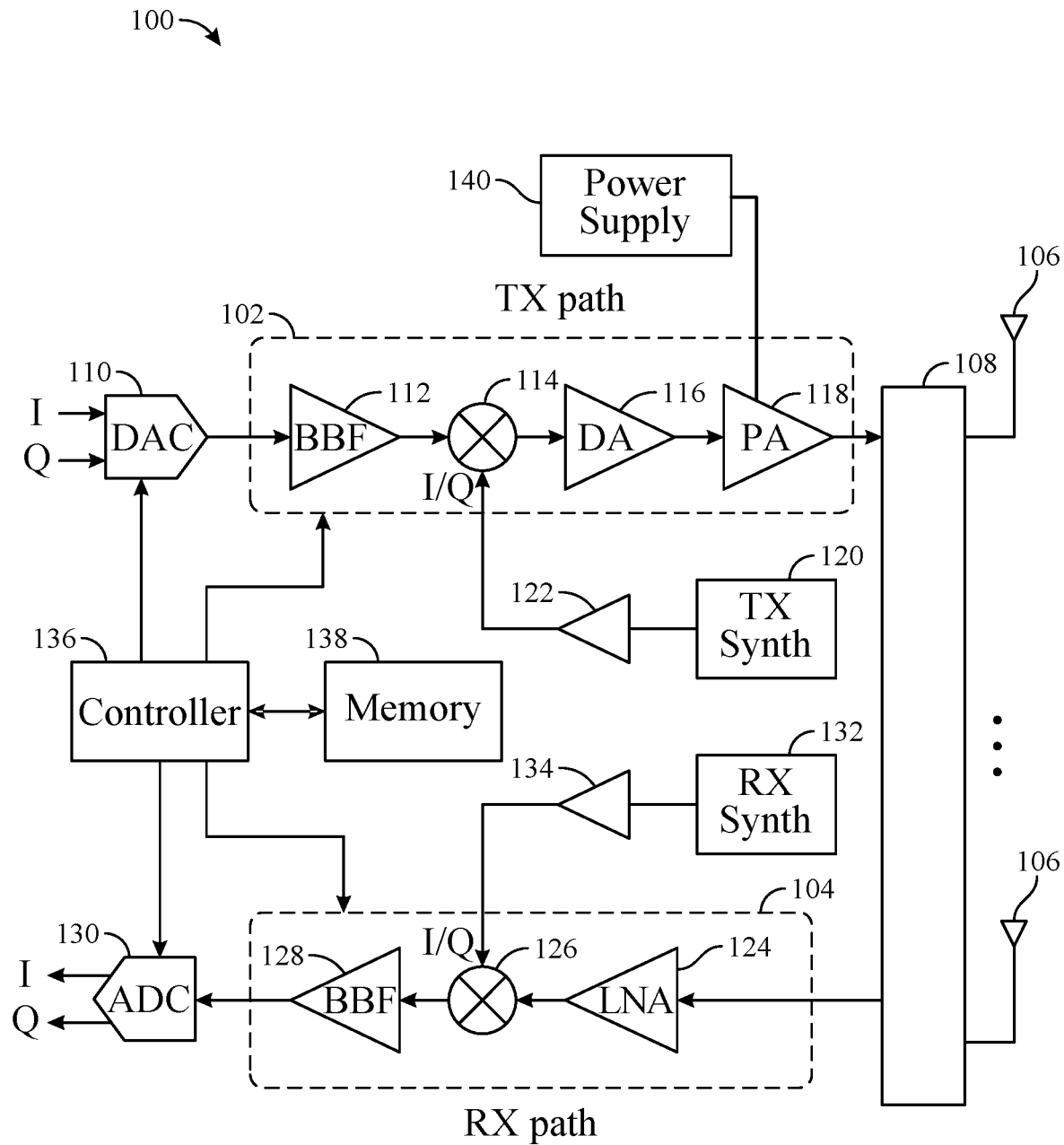
FIG. 1 is a block diagram of an example radio frequency transceiver, in accordance with certain aspects of the present disclosure.

Certain aspects of the present disclosure relate to a power supply circuit with switching circuitry and a method of selectively powering an amplifier.

A wireless communication device may include a transceiver (e.g., a radio frequency front-end (RFFE) circuit or RF transceiver circuit) for transmitting and/or receiving RF signals. The RF transceiver circuit may include a power supply circuit to provide a variable supply voltage (e.g., $V_{CC}$) to a power amplifier (PA) for power efficiency, for example, through average power tracking (APT) or envelope tracking (ET). In certain cases, the PA may be selectively powered in APT mode or ET mode. That is, in certain cases, the PA may be powered in APT mode, and in other cases, the PA may be powered in ET mode. In APT mode, a low pass filter implemented with an inductor-capacitor (LC) circuit may be coupled to the output of the power supply circuit in order to reduce the ripple on the output voltage from the power supply circuit on the PA, and in ET mode, the capacitor of the LC circuit may be disconnected from the PA due to the inherent filtering characteristics of the ET circuitry. For example, switching circuitry, such as two transistors coupled in series between the inductor and capacitor of the LC circuit, may be used to disconnect and connect the low pass filter from the PA.

In certain cases, a two-step process may be used to disconnect the capacitor of the LC circuit from the PA to prevent overstress on the various circuitry (e.g., gate-oxide overstress of the transistors) coupled to the low pass filter. That is, certain voltages may be applied to various nodes of the switching circuitry to allow the capacitor of the LC circuit to safely discharge without overstressing the other circuitry coupled to the capacitor, such as the switching circuitry. First, the capacitor of the LC circuit is discharged to a certain voltage below the high voltage of the APT mode and above the maximum gate-to-source voltage ($V_{gs}$) of the transistor in the switching circuitry coupled to the capacitor. Next, the gate of the transistor coupled to the inductor in the switching circuitry may be pulled to a voltage level of half the voltage at the capacitor, and the gate of the transistor coupled to the capacitor may be pulled down to a ground voltage. It may take a relatively long time (e.g., >1 μs) to execute such a two-step process in disconnecting the capacitor from the PA, particularly due to discharging the capacitor in the first step. That is, the two-step process in disconnecting the capacitor from the PA may take an undesirable amount of time to perform, such that the execution time may affect the latency of the transceiver.

Certain aspects of the present disclosure relate to a power supply circuit and a method of selectively powering an amplifier (from a selected power supply circuit) with switching circuitry that provides a relatively fast turn-off scheme (e.g., <1 μs) for disconnecting the capacitor at high voltages (e.g., >5 volts) from the PA without overstressing various components (e.g., gate-oxide overstress of the transistors implementing the switching circuitry). In certain aspects, the switch(es) coupled to the capacitor may have low on-resistance (Ron) for APT mode and low off-capacitance for ET mode. For example, instead of tying the disconnection process to a certain level of discharge for the capacitor, the first step may be to apply voltages to control inputs of the switching circuitry (e.g., in accordance with the maximum gate-to-source voltages of the transistors). Next, in the second step, a certain voltage may be applied at a node between the transistors in accordance with a maximum drain-to-source voltages of the transistors. Due to the lower capacitances of the control inputs and the node between the transistors relative to the capacitor, the control inputs and the node may discharge or be pulled down relatively fast. In certain aspects, the various methods and circuits described herein may provide a relatively faster turn-off scheme (e.g., <1 μs) for disconnecting the capacitor from the selected power supply circuit (and associated PA).

Example RF Transceiver

FIG. 1 is a block diagram of an example RF transceiver circuit 100, in accordance with certain aspects of the present disclosure. The RF transceiver circuit 100 includes at least one transmit (TX) path 102 (also known as a transmit chain) for transmitting signals via one or more antennas 106 and at least one receive (RX) path 104 (also known as a receive chain) for receiving signals via the antennas 106. When the TX path 102 and the RX path 104 share an antenna 106, the paths may be connected with the antenna via an interface 108, which may include any of various suitable RF devices, such as a switch, a duplexer, a diplexer, a multiplexer, and the like.

Receiving in-phase (I) or quadrature (Q) baseband analog signals from a digital-to-analog converter (DAC) 110, the TX path 102 may include a baseband filter (BBF) 112, a mixer 114, a driver amplifier (DA) 116, and a power amplifier (PA) 118. The BBF 112, the mixer 114, the DA 116, and the PA 118 may be included in a radio frequency integrated circuit (RFIC).

In aspects, a power supply 140 may provide a variable supply voltage to the PA 118 to facilitate efficient operation of the PA 118 in terms of power consumption. For example, the power supply 140 may include a switched-mode power supply (SMPS) configured to operate in APT mode or an AB amplifier configured to operate in ET mode. That is, the supply voltage of the power supply 140 may be adjusted using various techniques including APT and/or ET. In aspects, the power supply circuit 140 may include an LC circuit (not shown) coupled to the power rail of the PA 118, as further described herein with respect to FIG. 2. In certain cases, the capacitor of the LC circuit may be selectively disconnected and connected to the PA 118 depending on the technique used to supply power (e.g., APT or ET), as further described herein with respect to FIG. 2.

The BBF 112 filters the baseband signals received from the DAC 110, and the mixer 114 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 114 are typically RF signals, which may be amplified by the DA 116 and/or by the PA 118 before transmission by the antenna 106.

The RX path 104 may include a low noise amplifier (LNA) 124, a mixer 126, and a baseband filter (BBF) 128. The LNA 124, the mixer 126, and the BBF 128 may be included in a RFIC, which may or may not be the same RFIC that includes the TX path components. RF signals received via the antenna 106 may be amplified by the LNA 124, and the mixer 126 mixes the amplified RF signals with a receive local oscillator (LO) signal to convert the RF signal of interest to a different baseband frequency (e.g., downconvert). The baseband signals output by the mixer 126 may be filtered by the BBF 128 before being converted by an analog-to-digital converter (ADC) 130 to digital I or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 120, which may be buffered or amplified by amplifier 122 before being mixed with the baseband signals in the mixer 114. Similarly, the receive LO may be produced by an RX frequency synthesizer 132, which may be buffered or amplified by amplifier 134 before being mixed with the RF signals in the mixer 126. For certain aspects, a single frequency synthesizer may be used for both the TX path 102 and the RX path 104. In aspects, the TX frequency synthesizer 120 and/or RX frequency synthesizer 132 may include a frequency multiplier, such as a frequency doubler, that is driven by an oscillator (e.g., a VCO) in the frequency synthesizer.

A controller 136 may direct the operation of the RF transceiver circuit 100, such as transmitting signals via the TX path 102 and/or receiving signals via the RX path 104. The controller 136 may be a processor, a digital signal processor (DSP), an application specific integrated circuit (ASIC), a field programmable gate array (FPGA) or other programmable logic device (PLD), discrete gate or transistor logic, discrete hardware components, or any combination thereof. The memory 138 may store data and program codes for operating the RF transceiver circuit 100. The controller 136 and/or memory 138 may include control logic (e.g., CMOS logic).

While FIG. 1 provides an RF transceiver as an example application in which certain aspects of the present disclosure may be implemented to facilitate understanding, certain aspects described herein related to a power supply circuit with switching circuitry and a method of selectively powering an amplifier may be utilized in various other suitable electronic systems.

Example Power Supply Circuit

Figure 2:
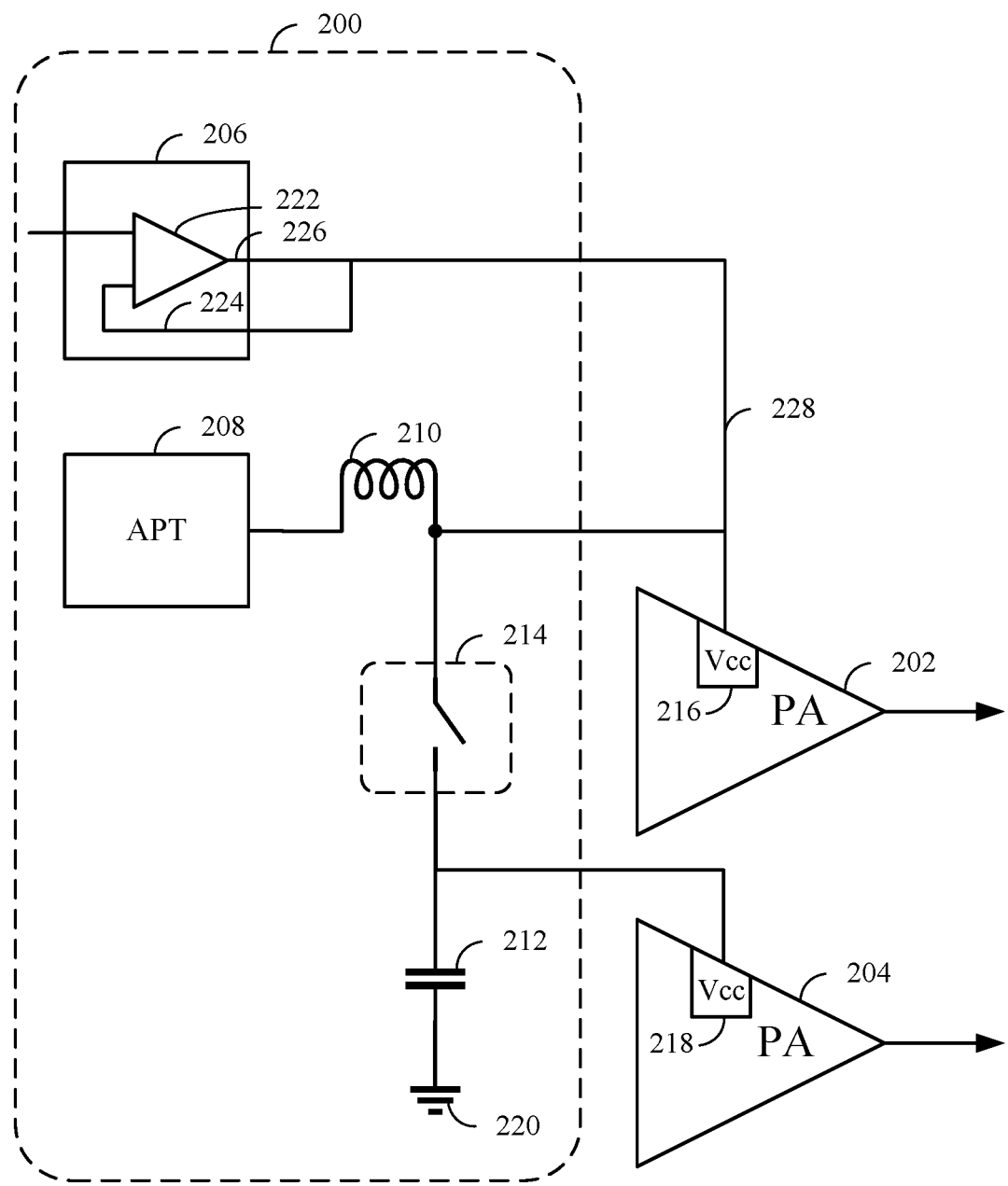
FIG. 2 is a block diagram of an example power supply circuit coupled to one or more amplifiers, in accordance with certain aspects of the present disclosure.

FIG. 2 is a block diagram of an example power supply circuit 200 coupled to one or more amplifiers (such as a first amplifier 202 and an optional second amplifier 204, which may be power amplifiers, as shown), in accordance with certain aspects of the present disclosure. As shown, the power supply circuit 200 includes ET circuitry 206, APT circuitry 208, an inductive element 210, a capacitive element 212, and switching circuitry 214.

The ET circuitry 206 tracks the amplitude envelope of the radio frequency signal input to the first amplifier 202 and adjusts the supply voltage of the first amplifier 202 based on the envelope. For example, the supply voltage may be proportional to the amplitude envelope of the signal. That is, as the amplitude envelope of the signal increases, the ET circuitry 206 may increase the supply voltage, and as the amplitude envelope of the signal decreases, the ET circuitry 206 may decrease the supply voltage. In aspects, the ET circuitry 206 may include a third amplifier 222 having an input 224 coupled to an output 226. In certain aspects, the third amplifier 222 may be a class AB amplifier. The ET circuitry 206 may be coupled to a power terminal of the first amplifier 202 in which the supply voltage is input. In certain cases, the ET circuitry 206 may operate when the switching circuitry 214 is open, such that the ET circuitry 206 provides the supply voltage to the first amplifier 202, but may not provide power to the second amplifier 204. With the switching circuitry 214 open, the ET circuitry 206 may be disconnected from the capacitor 212 and may avoid driving the relatively high capacitance of the capacitor 212.

The APT circuitry 208 may track the output power of the first and second amplifiers 202, 204 and adjust the supply voltage according to the average power during a certain time frame. In certain aspects, the APT circuitry 208 may be used in low power situations. In aspects, the APT circuitry 208 may include a three-level buck converter or a portion of the three-level buck converter such as the switches of the three-level buck converter. The APT circuitry 208 may be coupled to the first and second amplifiers 202, 204. For example, the APT circuitry 208 may be coupled to the power terminal 216 of the first amplifier 202 and the power terminal 218 of the second amplifier 204. In certain cases, the APT circuitry 208 may operate when the switching circuitry 214 is closed, such that the APT circuitry 208 provides the supply voltage to the first amplifier 202 and/or the second amplifier 204. With the switching circuitry 214 closed, the LC circuit (e.g., the inductive element 210 and capacitive element 212) may hold the output voltage and reduce voltage ripple from the APT circuitry 208.

The inductive element 210 may be an inductor, which is coupled between the APT circuitry 208 and a node 228 coupled to the switching circuitry 214, the power terminal 216 of the first amplifier 202, and the output 226 of the third amplifier 222. In aspects, the inductive element 210 may be implemented by a network of inductors. In certain cases, the inductive element 210 may be part of a SMPS, such as the inductor in a buck converter or three-level buck converter.

The capacitive element 212 may be a capacitor such as a tantalum capacitor, ceramic capacitor, aluminum capacitor, or the like. In certain cases, the capacitor may have a capacitance of 4.7 µF with a breakdown voltage of 10 volts. In aspects, the capacitive element 212 may be implemented by a network of capacitors. The capacitive element 212 may be selectively coupled by the switching circuitry 214 along a shunt branch between the node 228 and a reference node 220, such as electrical ground for the power supply circuit 200. In this manner, the capacitive element 212 may be selectively coupled to at least one power terminal 216 of the first amplifier 202 and may be coupled to at least one power terminal 218 of the optional second amplifier 204. That is, a terminal of the capacitive element 212 may be coupled to the switching circuitry 214, and another terminal of the capacitive element 212 may be coupled to the reference node 220. In aspects, the inductive element 210 and capacitive element 212 may form an LC circuit that may function, for example, as a low-pass filter that prevents or reduces the effect of switching noise and ripple voltage from the APT circuitry 208 on the first and second amplifiers 202, 204.

The switching circuitry 214 may be configured to apply certain voltages at various nodes to safely switch from an APT mode to an ET mode without overstressing various components due to the stored charge of the capacitive element 212, as further described herein with respect to FIGS. 3-8. In certain cases, when the switching circuitry 214 is closed, the APT circuitry 208 provides the supply voltage to the first amplifier 202 and/or the second amplifier 204. When the switching circuitry 214 is open, the ET circuitry 206 may provide the supply voltage to the first amplifier 202.

The first and second amplifiers 202, 204 may be power amplifiers, for example, in a transceiver (e.g., the RF transceiver circuit 100). In certain aspects, the first amplifier 202 may be used in a transmit path of one or more radio access technologies (RATs) (such as Evolved Universal Terrestrial Radio Access (E-UTRA) or 5G New Radio), and the second amplifier 204 may be used in a transmit path of one or more other RATs (such as CDMA2000 or Global System for Mobile Communications (GSM)).

Figure 3:
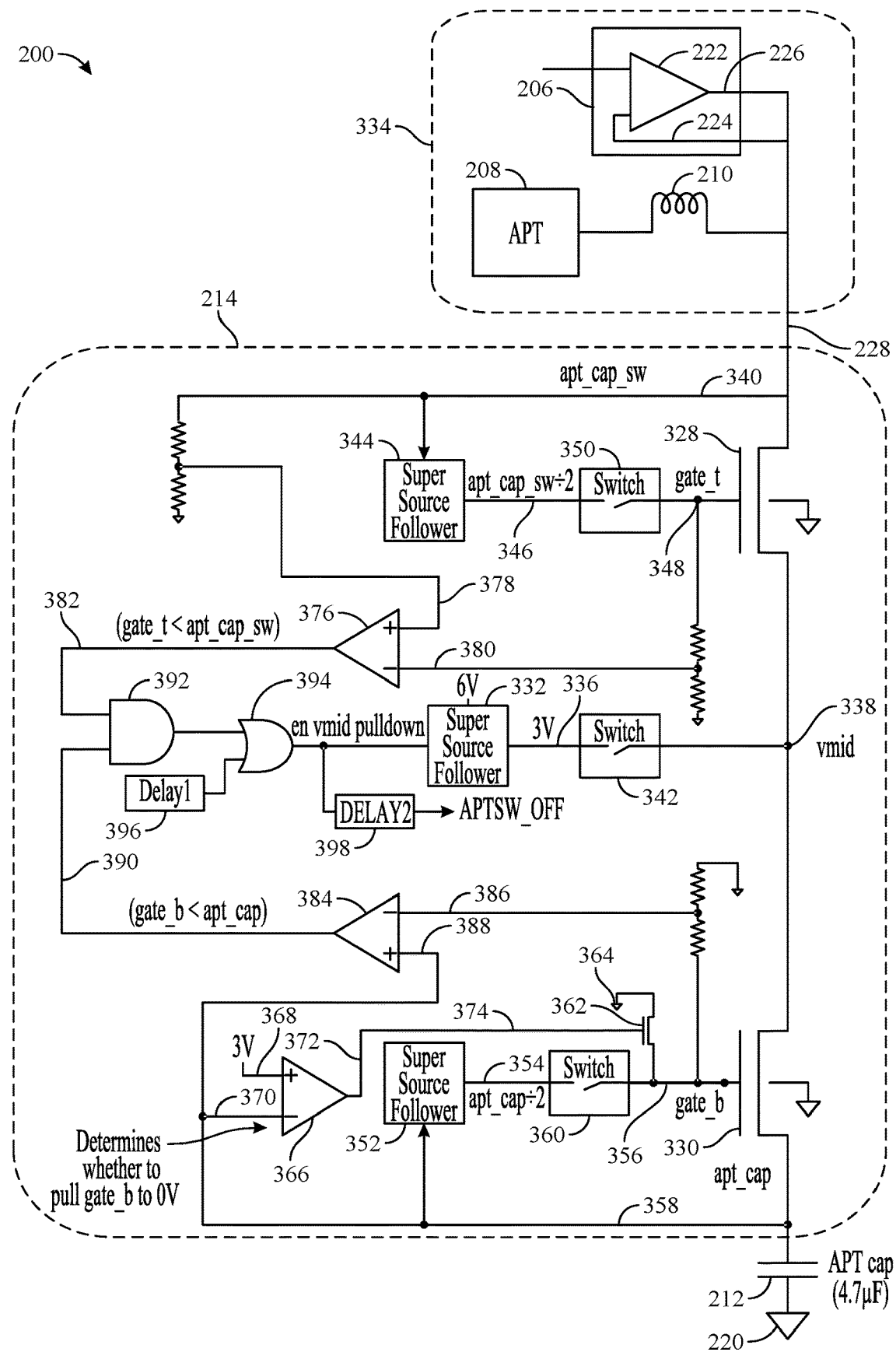
FIG. 3 is a block diagram of the example power supply circuit with further aspects of example switching circuitry, in accordance with certain aspects of the present disclosure.

FIG. 3 is a block diagram of the power supply circuit 200 with further details on the switching circuitry 214, in accordance with certain aspects of the present disclosure. As shown, the switching circuitry 214 may include a first switch 328, a second switch 330, and a first buffer circuit 332.

The first switch 328 may be configured to be closed in a first mode and to be open in a second mode. For example, the first mode may include an average power tracking (APT) mode, and the second mode may include an envelope tracking (ET) mode. The first switch 328 may be coupled in series between the ET/APT circuitry 334 (including the ET circuitry 206, the APT circuitry 208, and the inductive element 210) and the second switch 330. In aspects, the first switch 328 may be implemented by a transistor, such as an n-type metal-oxide-semiconductor (NMOS) transistor. The NMOS transistor may provide relatively low on-resistance (Ron) and relatively low off-capacitance for use in the power supply circuit 200, compared to other types of transistors or alternative switch implementations.

The second switch 330 may be configured to be closed in the first mode and to be open in the second mode. The second switch 330 may be coupled in series between the first switch 328 and the capacitive element 212. In aspects, the second switch 330 may be a transistor, such as an NMOS transistor.

A first circuit (e.g., the APT circuitry 208 and inductive element 210) of the ET/APT circuitry 334 may be coupled to the first switch 328 and configured to charge the capacitive element 212 and power an amplifier (e.g., the first amplifier 202 and/or the second amplifier 204) in the first mode. The APT circuitry 208 and inductive element 210 may be referred to herein as the first circuit. In aspects, the first circuit may include a switched-mode power supply circuit (e.g., the APT circuitry 208) having an inductive element (e.g., the inductive element 210) coupled to the first switch 328.

The first buffer circuit 332 may have an output 336 coupled to a first node 338 (labeled "vmid") between the first switch 328 and the second switch 330. In certain aspects, the first buffer circuit 332 may be configured to output a first voltage level greater than half of a second voltage level at a second node 340 (labeled "apt_cap_sw" and the same as the node 228 depicted in FIG. 2) between the first circuit of the ET/APT circuitry 334 and the first switch 328. In certain cases, the first buffer circuit 332 may output the first voltage level at the first node 338, where the first voltage level may be set according to various thresholds to ensure drain-to-source voltages and drain-to-gate voltages are at or below certain maximums. For example, the first voltage level may be set less than a sum of a maximum drain-to-source voltage of the second switch 330 and a voltage of the capacitive element 212 after being charged by the APT circuitry 208; greater than a difference between a second voltage level at the second node 340 and a maximum drain-to-source voltage of the first switch 328; greater than a first control voltage for the first switch 328 after opening the first switch 328; and less than a sum of a maximum drain-to-gate voltage of the second switch 330 and a second control voltage for the second switch 330 after opening the second switch 330. The first buffer circuit 332 may be a super-source-follower circuit. A super-source-follower circuit may provide a low level of DC with a high bandwidth. In aspects, a third switch 342 may be coupled in series between the first buffer circuit 332 and the first node 338 and configured to selectively apply the output of the first buffer circuit 332 to the first node 338.

A second circuit (e.g., the ET circuitry 206) of the ET/APT circuitry 334 may be configured to power the amplifier (e.g., the first amplifier 202) in the second mode. The ET circuitry 206 may be referred to herein as the second circuit. The input 224 of the third amplifier 222 may be coupled to the second node 340 and the output 226, which may be capacitively coupled to the second node 340.

The switching circuitry 214 may further include a second buffer circuit 344 having an output 346 coupled to a control input 348 (labeled "gate_t" for top gate) of the first switch 328. The second buffer circuit 344 may be configured to apply a control voltage at an intermediate voltage associated with the second voltage level (e.g., less than the second voltage level, such as half of the second voltage level) to open the first switch 328 for the second mode. In certain aspects, the second buffer circuit 344 may output the control voltage for the first switch 328 at a third voltage less than a maximum gate-to-source voltage of the first switch 328. The second buffer circuit 344 may be a super-source-follower circuit. In aspects, a fourth switch 350 may be coupled in series between the second buffer circuit 344 and the control input 348 and configured to selectively apply the output 346 of the second buffer circuit 344 to the control input 348 of the first switch 328.

The switching circuitry 214 may further include a third buffer circuit 352 having an output 354 coupled to a control input 356 (labeled "gate_b" for bottom gate) of the second switch 330. The third buffer circuit 352 may be configured to apply a control voltage at an intermediate voltage associated with a third voltage level (e.g., less than the third voltage level, such as half of the third voltage level) to a third node 358 (labeled "apt_cap") between the second switch 330 and the capacitive element 212. In certain aspects, third buffer circuit 352 may output the control voltage for the second switch 330 at a fourth voltage level less than a maximum gate-to-source of the second switch 330. The third buffer circuit 352 may be a super-source-follower circuit. In aspects, a fifth switch 360 may be coupled in series between the third buffer circuit 352 and the control input 356 and configured to selectively apply the output 354 of the third buffer circuit 352 to the control input 356 of the second switch 330.

The switching circuitry 214 may further include a sixth switch 362 coupled between the control input 356 of the second switch 330 and a ground node 364 and configured to apply a ground voltage to the control input 356 of the second switch 330 to open the second switch 330 for the second mode. Pulling the control input 356 to ground may ensure that the second switch is open and prevent any overstress effects on the second switch 330 (e.g., gate-oxide overstress of the second switch 330). In aspects, the ground node 364 may have the same voltage and/or be the same node as the reference node 220.

The sixth switch 362 may be configured to apply the ground voltage if a voltage at the third node 358 between the second switch 330 and the capacitive element 212 is less than a threshold voltage. For example, a first comparator 366 may be configured to determine that the voltage at the third node 358 is less than a threshold voltage (e.g., 3 V, as depicted). The first comparator 366 may have a first input 368 supplied with the threshold voltage, a second input 370 coupled to the third node 358, and an output 372 coupled to a control input 374 of the sixth switch 362.

The switching circuitry 214 may further include at least one comparator (e.g., a second comparator 376 and a third comparator 384) configured to determine that a first control voltage of the first switch 328 is less than the second voltage level at the second node 340 and that a second control voltage of the second switch 330 is less than the third voltage level at the third node 358. For example, the second comparator 376 may be configured to determine that the first control voltage of the first switch 328 is less than the second voltage level at the second node 340, and the third comparator 384 may be configured to determine that the second control voltage of the second switch 330 is less than the third voltage level at the third node 358. The second comparator 376 may have a first input 378 coupled to the second node 340 (e.g., via a voltage divider, as shown), a second input 380 coupled to the control input 348 of the first switch 328 (e.g., via another voltage divider, as shown), and an output 382 coupled (e.g., via a logic circuit) to the first buffer circuit 332. The third comparator 384 may have a first input 386 coupled to the control input 356 of the second switch 330 (e.g., via yet another voltage divider, as shown), a second input 388 coupled to the third node 358, and an output coupled to the first buffer circuit 332 (e.g., via the logic circuit).

In aspects, the first buffer circuit 332 may be configured to output the first voltage level after the determination of the first control voltage and the second control voltage with the second and third comparators 376, 384. For example, an AND gate 392 may have inputs coupled to the outputs 382, 390 of the second and third comparators 376, 384 and have an output coupled to the first buffer circuit 332. The AND gate 392 may effectively determine when the first control voltage is less than the second voltage level at the second node 340 and when the second control voltage is less than the third voltage level at the third node 358.

In certain aspects, the first buffer circuit 332 may be configured to output the first voltage level after a delay timer has expired. For example, an OR gate 394 may have a first input coupled to an output of the AND gate 392 and have an output coupled to an input of the first buffer circuit 332. A second input of the OR gate 394 may be coupled to a first delay timer 396 (labeled "delay1"), such that the OR gate 394 enables the first buffer circuit 332 to apply the first voltage level depending on whether the first delay timer 396 expires or the output of the AND gate 392 is logic high (i.e., the determination of both the first control voltage and the second control voltage with the second and third comparators 376, 384). The first delay timer 396 may be started based on at least one of opening the first switch 328 or opening the second switch 330. That is, the first delay timer 396 may be started when the second and third buffer circuits 344, 352 apply the control voltages to the first and second switches 328, 330. In certain cases, the first delay timer 396 may be started once the operation to open the switching circuitry 214 is initialized, for example, as described herein with respect to FIG. 4. After expiration of the first delay timer 396, the first buffer circuit 332 may output the first voltage level.

According to certain aspects, the second circuit (e.g., the ET circuitry 206) may be coupled to the second node 340 and configured to power an amplifier (e.g., the first amplifier 202) in the second mode upon expiration of a delay timer that is started based on outputting the first voltage level at the first node 338. For example, a second delay timer 398 (delay2) may be coupled to the output of the OR gate 394 and start running after the OR gate 394 goes high. The second delay timer 398 may indicate when the switching circuitry 214 is off and the ET circuitry 206 may be enabled to power the first amplifier 202.

Figure 4:
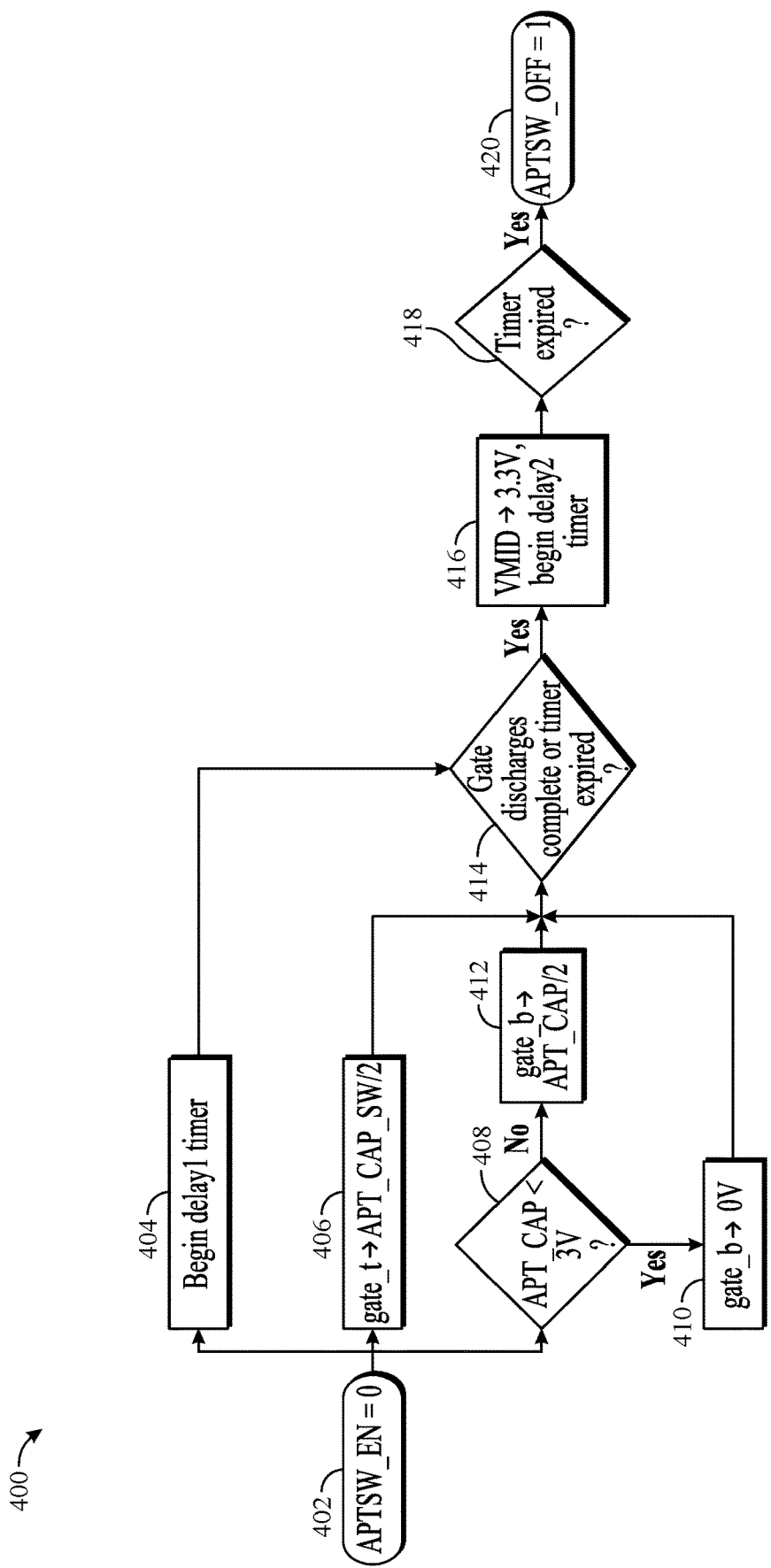
FIG. 4 is a flow diagram of example operations for opening switches of the power supply circuit of FIG. 3, in accordance with certain aspects of the present application.

FIG. 4 illustrates a flow diagram of example operations 400 for opening the switches 328, 330 of FIG. 3, in accordance with certain aspects of the present application. As shown, at block 402, the operations 400 may be initialized, for example, due to a change from a low power state to a high power state for the transmit path of a transceiver. For example, a control signal (APTSW_EN) representing the opened or closed state of the switching circuitry may change to a logic low, which may indicate when to initialize the operations 400. At block 404, the first delay timer 396 may start running once the operations 400 are initialized. At block 406, the second buffer circuit 344 may apply a control voltage for the first switch 328 at an intermediate voltage associated with the second voltage level to the second node 340. For example, the fourth switch 350 may be closed at block 406 to apply the control voltage from the second buffer circuit 344 to the control input 348 of the first switch 328.

At block 408, the first comparator 366 may determine whether the voltage at the third node 358 is less than the threshold voltage (e.g., <3 volts). If the voltage at the third node 358 is less than the threshold voltage, at block 410 the control input 356 of the second switch 330 may be coupled to a ground node, for example, via the sixth switch 362. If the voltage at the third node 358 is greater than or equal to the threshold voltage, at block 412 the third buffer circuit 352 may apply a control voltage for the second switch 330 at an intermediate voltage associated with the third voltage level to the third node 358. For example, the fifth switch 360 may be closed at block 412 to apply the control voltage from the third buffer circuit 352 to the control input 356 of the second switch 330.

At block 414, the OR gate 394 may determine whether the discharge at both the control inputs 348, 356 of the first and second switches 328, 330 is complete or whether the first delay timer 396 has expired. After the OR gate 394 goes logic high at block 414, the first buffer circuit 332 may apply, at the first node 338, a first voltage level greater than half of the second voltage level at the second node 340 at block 416. For example, the third switch 342 may be closed at block 416 to apply the first voltage level from the first buffer circuit 332 at the first node 338. At block 416, the second delay timer 398 may also start after the OR gate 394 goes logic high. At block 418, the switching circuitry 214 may wait until the second delay time 396 has expired. At block 420, after the expiration of the second delay timer 398, the switching circuitry 214 may indicate that the first and second switches 328, 330 are open, which enables the ET circuitry 206 for powering an amplifier (e.g., the first amplifier 202).

Figure 5:
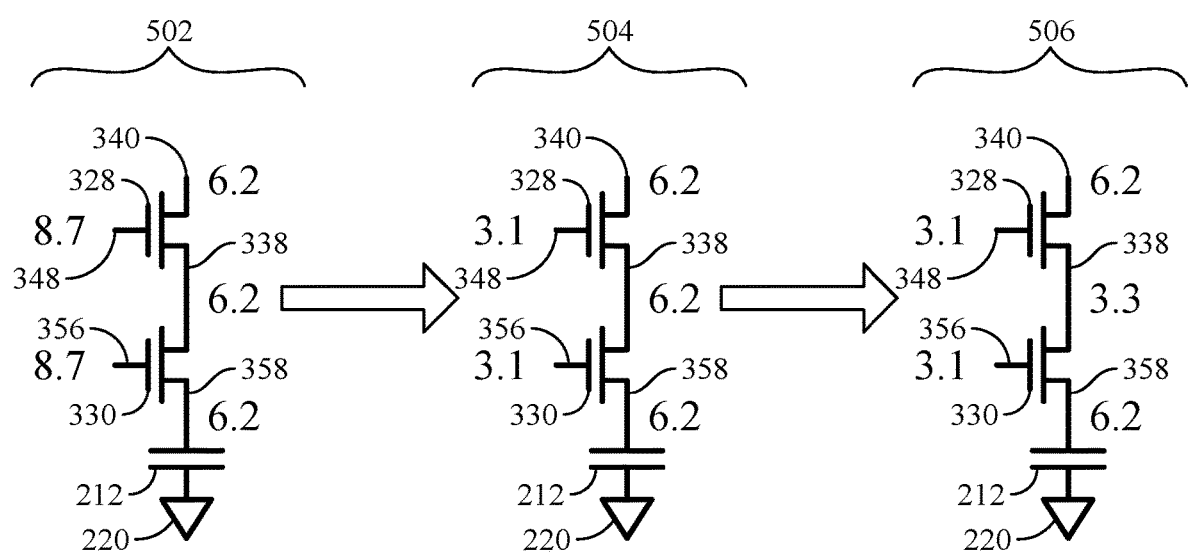
FIG. 5 is a diagram view of example operations for opening switches of the power supply of FIG. 3, in accordance with certain aspects of the present disclosure.

FIG. 5 is a diagram view of the example operations 400 for opening the switching circuitry 214 of FIG. 3, in accordance with certain aspects of the present disclosure. As shown, at an APT mode 502, the switching circuitry 214 may be closed, such that the capacitive element 212 is charged, for example, via the operation of the APT circuitry 208. The first, second, and third nodes 338, 340, 358 may be at the same voltage level (e.g., 6.2 volts), and the control inputs 348, 356 of the first and second switches 328, 330 may be at a certain control voltage (e.g., 8.7 volts) that enables the first and second switches 328, 330 to be closed (e.g., greater than the threshold voltage of the transistors).

At a first phase 504 of opening the switching circuitry 214, the control voltages at the control inputs 348, 356 may be adjusted to certain voltages within the maximum gate-to-source voltages of the first and second switches 328, 330. For example, the control voltage at the control input 348 may be pulled down to half the voltage at the second node 340, and the control voltage at the control input 356 may be pulled down to half the voltage at the third node 358. In certain aspects, the first phase 504 may correspond to the blocks 406 and 412 of the operations 400 of FIG. 4. That is, the second and third buffer circuits 344, 352 may pull down the control voltages at the control inputs 348, 356 at blocks 406 and 412.

At a second phase 506 of opening the switching circuitry 214, a voltage at the first node 338 may be adjusted to be within the maximum drain-to-source voltages of the first and second switches 328, 330. For example, the voltage at the first node 338 may be pulled down to a voltage level (e.g., 3.3 volts) greater than half of the voltage at the second node 340. In certain aspects, the second phase 506 may correspond to the block 416 of the operations 400 of FIG. 4. That is, the first buffer circuit 332 may pull down the voltage at the first node at block 416.

Figure 6:
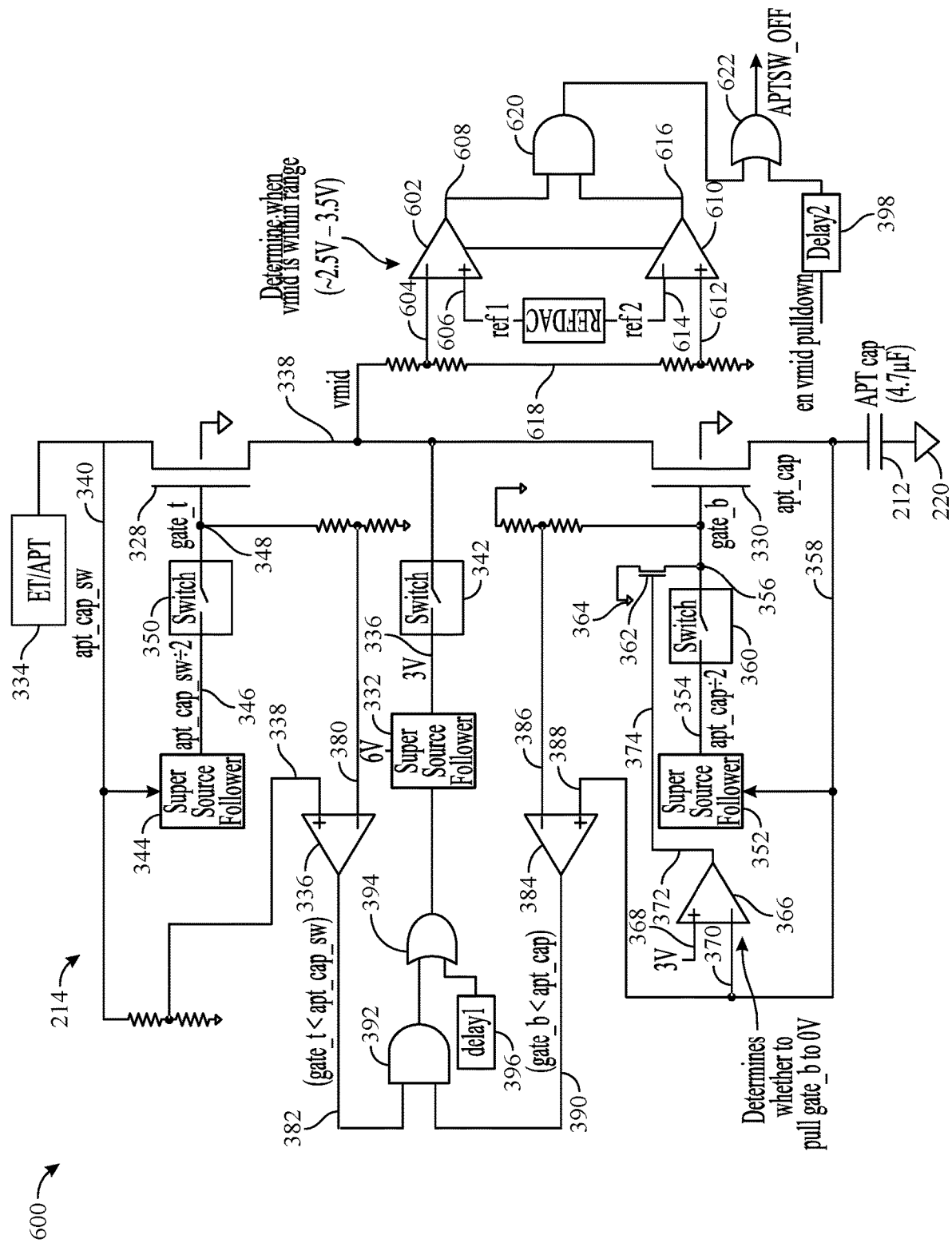
FIG. 6 is a block diagram of another example power supply circuit with comparison circuitry for indicating when the switches are open, in accordance with certain aspects of the present disclosure.

In certain aspects, the switching circuitry 214 may verify that the voltage at the first node 338 is within a certain range before indicating that the first and second switches 328, 330 are open for ET mode. That is, the voltage at the first node may be detected, and the first and second switches may be considered to be open when the voltage at the first node is within a certain range, which may further ensure no over-stress issues. For example, FIG. 6 is a block diagram of an example power supply circuit 600 with comparison circuitry, in accordance with certain aspects of the present disclosure. As shown, the power supply circuit 600 includes a fourth comparator 602, a fifth comparator 610, a reference digital-to-analog converter (DAC) 618, an AND gate 620, and an OR gate 622.

The fourth and fifth comparators 602, 610 may determine that a voltage at the first node 338 is within a certain range of voltages, such as a range of voltages greater than half of the voltage at the second node 340. For example, the fourth comparator 602 may determine whether the voltage at the first node 338 is less than a first reference voltage (e.g., 3.5 volts), and the fifth comparator 610 may determine whether the voltage at the first node 338 is greater than a second reference voltage (e.g., 2.5 volts). The fourth comparator 602 may have a first input 604 coupled to the first node 338, a second input 606 coupled to the reference DAC 618, and an output 608 coupled to the AND gate 620. The fifth comparator 610 may have a first input 612 coupled to the first node 338, a second input 614 coupled to the reference DAC 618, and an output 616 coupled to the AND gate 620. The reference DAC 618 may provide the reference voltages for the fourth and fifth comparators 602, 610.

The AND gate 620 may determine when voltage at the first node 338 satisfies the fourth and fifth comparators 602, 610. The OR gate 622 may indicate when the AND gate 620 goes high or the second delay timer 398 expires, as described herein with respect to FIG. 3. That is, the OR gate 622 may indicate when the first and second switches 328, 330 are open and when the ET circuitry 206 may be enabled to power the first amplifier 202. For example, the second circuit (e.g., the ET circuitry 206) may be configured to power the first amplifier 202 in the second mode based on the determination that the voltage at the first node is within the range of voltages.

Figure 7:
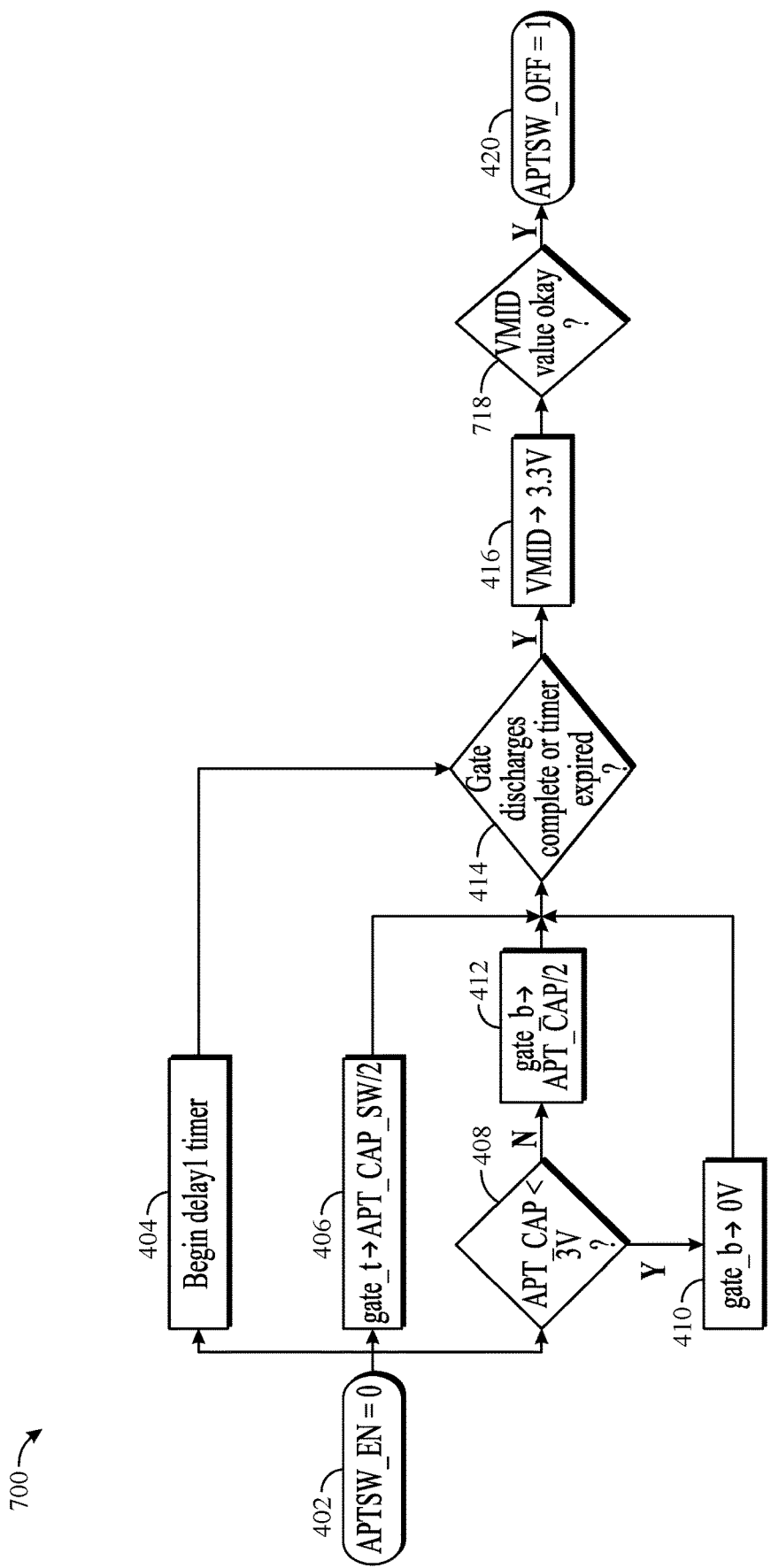
FIG. 7 is a flow diagram of example operations for opening the switches of the power supply circuit with comparison circuitry of FIG. 6, in accordance with certain aspects of the present disclosure.

FIG. 7 illustrates a flow diagram of example operations 700 for opening the switching circuitry 214 of FIG. 6, in accordance with certain aspects of the present disclosure. As shown, the operations 700 may follow the operations 400, except at block 718, where the fourth and fifth comparators 602, 610 may determine that a voltage at the first node 338 is within a certain range of voltages, as described herein with respect to FIG. 6. That is, at block 718, the switching circuitry 214 may wait until the second delay timer 396 has expired or until the voltage at the first node 338 is determined to be within a certain range of voltages. At block 420, after the expiration of the second delay timer 398 or after it is determined that the voltage at the first node 338 is within a certain range of voltages, the switching circuitry 214 may indicate that the first and second switches 328, 330 are open, which enables the ET circuitry 206 for powering an amplifier (e.g., the first amplifier 202).

Figure 8:
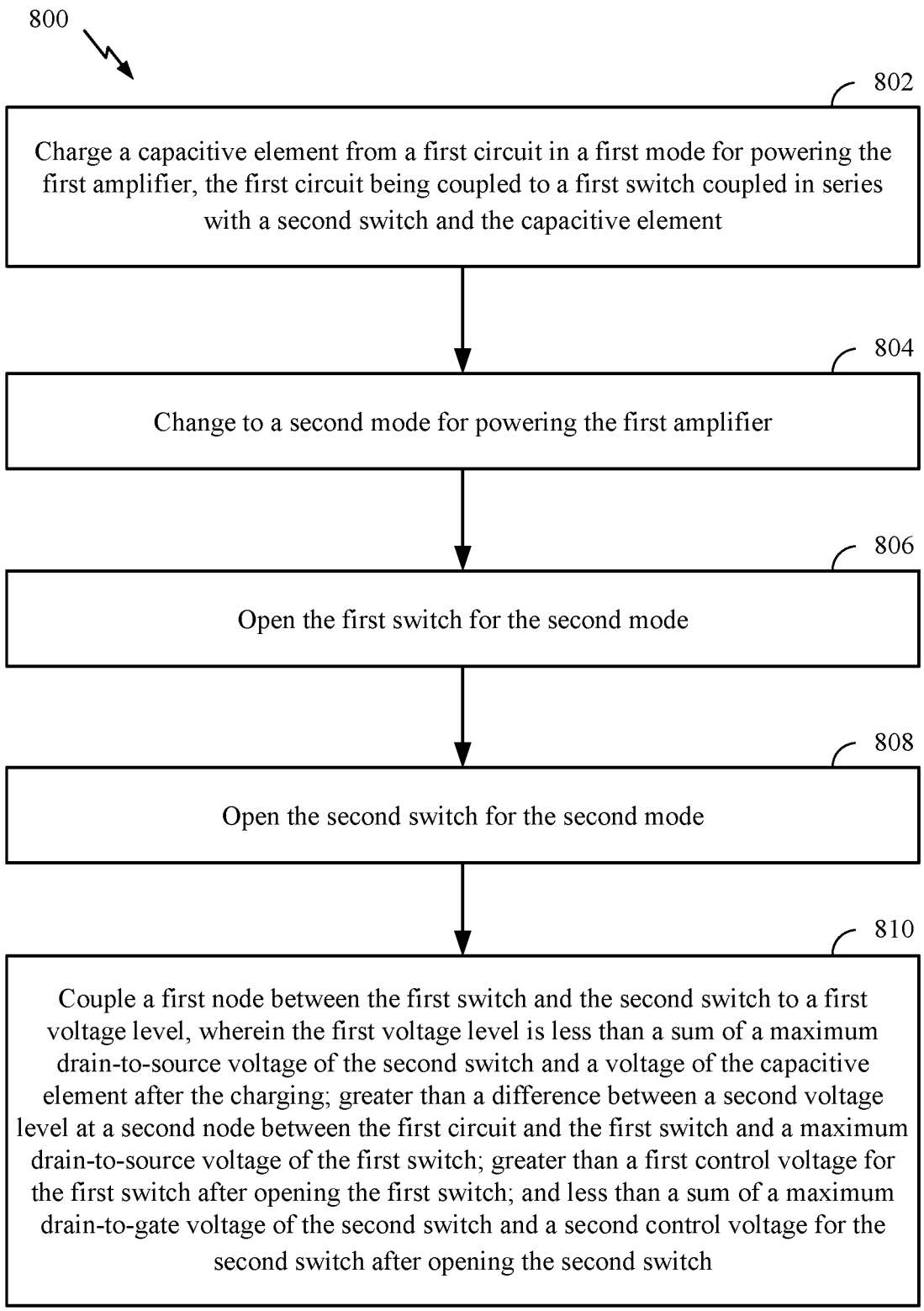
FIG. 8 is a flow diagram of example operations for selectively powering an amplifier, in accordance with certain aspects of the present disclosure.

FIG. 8 is a flow diagram of example operations 800 for selectively powering an amplifier (e.g., the first amplifier 202), in accordance with certain aspects of the present disclosure. The operations 800 may be performed by a power supply circuit, such as the power supply circuit 200, 300, or 600.

The operations 800 may begin at block 802, by charging a capacitive element (e.g., the capacitive element 212) from a first circuit (e.g., the APT circuitry 208) in a first mode (e.g., APT mode) for powering a first amplifier (e.g., the first amplifier 202), the first circuit being coupled to a first switch (e.g., the first switch 328) coupled in series with a second switch (e.g., the second switch 330) and the capacitive element. At block 804, a power supply circuit (e.g., the power supply circuit 200) may change from the first mode to a second mode (e.g., ET mode) for powering the first amplifier. At block 806, the first switch may open for the second mode. At 808, the second switch may open for the second mode. At 810, a first node (e.g., the first node 338) may be coupled between the first switch and the second switch to a first voltage level, wherein the first voltage level is less than a sum of a maximum drain-to-source voltage of the second switch and a voltage of the capacitive element after the charging (at block 802); greater than a difference between a second voltage level at a second node (e.g., the second node 340) between the first circuit and the first switch and a maximum drain-to-source voltage of the first switch; greater than a first control voltage for the first switch after opening the first switch (at block 806); and less than a sum of a maximum drain-to-gate voltage of the second switch and a second control voltage for the second switch after opening the second switch (at block 808).

In aspects, charging the capacitive element from the first circuit at block 802 may be performed before changing to the second mode at block 804, opening the first switch at block 806, opening the second switch at block 808, and coupling the first node to the first voltage level at block 810. That is, the first and second switches may be closed while the capacitive element is charged from the first circuit at block 802. Charging the capacitive element from the first circuit at block 802 may correspond to the APT mode 502 of FIG. 5. In certain aspects, the first circuit of operations 800 may include a switched-mode power supply (SMPS) circuit having an inductive element (e.g., the inductive element 210) coupled to the first switch. In certain cases, the SMPS circuit may include a three-level buck converter or a portion of the three-level buck converter, such as the switches of the three-level buck converter.

In certain aspects, the first mode may include an average power tracking mode, and the second mode may include an envelope tracking mode with a second circuit (e.g., the ET circuitry 206) coupled to the second node. The second circuit may include an amplifier (e.g., the third amplifier 222) having an input (e.g., the input 224) coupled to the second node and an output (e.g., the output 226) capacitively coupled to the second node.

In aspects, opening the first switch at block 806 may involve applying a certain control voltage to a control input (e.g., the control input 348) of the first switch, for example, as described herein with respect to the first phase 504 of FIG. 5. For example, opening the first switch at block 806 may include applying a control voltage for the first switch at a third voltage level less than a maximum gate-to-source voltage of the first switch. In certain cases, a buffer circuit (e.g., the second buffer circuit 344) may apply the control voltage to the control input of the first switch.

In aspects, opening the second switch at block 808 may involve applying a certain control voltage to a control input (e.g., the control input 356) of the second switch, for example, as described herein with respect to the first phase 504 of FIG. 5. For example, opening the second switch may include applying a control voltage for the second switch at a fourth voltage level less than a maximum gate-to-source voltage of the second switch. In certain cases, a buffer circuit (e.g., the third buffer circuit 352) may apply the control voltage to the control input of the second switch. In aspects, opening the first switch at block 806 and opening the second switch at block 808 may be performed concurrently, for example, as described herein with respect to FIGS. 4 and 5.

In certain aspects, opening the second switch at block 808 may involve coupling the control input of the second switch to a ground node (e.g., the ground node 364), for example, with the first comparator 366 and sixth switch 362. For instance, opening the second switch at block 808 may include coupling a control voltage of the second switch to the ground node. In aspects, the control voltage of the second switch may be coupled to the ground node if a voltage at the third node is less than a threshold voltage.

In certain aspects, the operations 800 may involve determining whether control voltages at the first and second switches satisfy certain thresholds before coupling the first node to the first voltage level at block 810. For example, the operations 800 may use comparators (e.g., the second comparator 376 and third comparator 384) to monitor the voltages at the control inputs of the first and second switches, and if the control voltages satisfy certain thresholds, the first node may be coupled to the first voltage level. The operations 800 may include determining that a first control voltage for the first switch is less than the second voltage level at the second node and that a second control voltage for the second switch is less than the third voltage level at the third node. Coupling the first node to the first voltage level at block 810 may include coupling the first node to the first voltage level after the determination of the first control voltage and the second control voltage. In certain aspects, coupling the first node to the first voltage level at block 810 may include applying a voltage signal at the first voltage level to the first node with a source follower circuit.

In certain aspects, the operations 800 may involve coupling the first node to the first voltage level at block 810 after a delay timer has expired, for example, as described herein with respect to the first delay timer 396. As an example, coupling the first node to the first voltage level at block 810 may include coupling the first node to the first voltage level after a timer has expired, where the timer is started based on at least one of opening the first switch or opening the second switch (e.g., applying the control voltages with the buffer circuits). After expiration of the first delay timer 396, the first node may be coupled to the first voltage level, for example, via the first buffer circuit 332.

In aspects, the operations 800 may involve changing to the second mode at 804 after an indication is generated by comparator or the expiration of a delay timer (e.g., the second delay timer 398). For example, changing to the second mode at 804 is completed upon expiration of the second delay timer. In certain cases, the switching circuitry 214 may verify that the voltage at the first node is within a certain range before indicating that the first and second switches 328, 330 are open for ET mode. For example, the operations 800 may further include determining that a voltage at the first node is within a range of voltages, and changing to the second mode at block 804 is completed based on the determination that the voltage at the first node is within the range.

The various operations of methods described above may be performed by any suitable means capable of performing the corresponding functions. The means may include various hardware and/or software component(s) and/or module (s), including, but not limited to a circuit, an application specific integrated circuit (ASIC), or processor.

For example, means for powering the amplifier in a first mode may include APT circuitry (e.g., the APT circuitry 208). Means for selectively coupling a capacitive element to the means for powering the amplifier in the first mode may include a first switch (e.g., the first switch 328) coupled in series with a second switch (e.g., the second switch 330). Means for changing to a second mode for powering the amplifier may include ET circuitry (e.g., the ET circuitry 206). Means for controlling the first switch may include a control input (e.g., the control input 348). Means for controlling the second switch may include a control input (e.g., the control input 356). Means for coupling a first node between the first switch and the second switch may include a buffer circuit (e.g., the first buffer circuit 332).

Based on the present disclosure, it should be appreciated that the various power supply circuits and the method of selectively powering an amplifier enable a relatively fast turn-off scheme (e.g., <1 µs, such as a few hundred nanoseconds) at a relatively high voltage (e.g., >5 volts, such as 6.2 volts) for disconnecting a capacitor from the power supply rail for the amplifier. The various circuits and methods described herein may facilitate a desirable transition time from an APT mode to ET mode, for example, from a low power transmission case to a high power transmission case.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A method of selectively powering a first amplifier, comprising:
    charging a capacitive element from a first circuit in a first mode for powering the first amplifier, the first circuit being coupled to a first switch coupled in series with a second switch and the capacitive element;
    changing to a second mode for powering the first amplifier;
    opening the first switch for the second mode;
    opening the second switch for the second mode; and
    applying a first voltage level to a first node between the first switch and the second switch, wherein the first voltage level is:
        less than a sum of a maximum drain-to-source voltage of the second switch and a voltage of the capacitive element after the charging;
        greater than a difference between a second voltage level at a second node between the first circuit and the first switch and a maximum drain-to-source voltage of the first switch;
        greater than a first control voltage for the first switch after opening the first switch; and
        less than a sum of a maximum drain-to-gate voltage of the second switch and a second control voltage for the second switch after opening the second switch.

2. The method of claim 1, wherein:
    the first mode comprises an average power tracking mode;
    the second mode comprises an envelope tracking mode with a second circuit coupled to the second node;
    the first circuit comprises a switched-mode power supply circuit having an inductive element coupled to the first switch; and
    the second circuit comprises a second amplifier having an input coupled to the second node and an output capacitively coupled to the second node.

3. The method of claim 1, wherein:
    opening the first switch comprises applying the first control voltage for the first switch at a third voltage level less than a maximum gate-to-source voltage of the first switch; and
    opening the second switch comprises applying the second control voltage for the second switch at a fourth voltage level less than a maximum gate-to-source voltage of the second switch.

4. The method of claim 1, wherein opening the second switch comprises coupling a control input of the second switch to a ground node if a voltage at a third node between the second switch and the capacitive element is less than a threshold voltage.

5. The method of claim 1, further comprising:
   determining that the first control voltage for the first switch is less than the second voltage level at the second node and that the second control voltage for the second switch is less than a third voltage level at a third node between the second switch and the capacitive element, wherein applying the first voltage level to the first node comprises applying the first voltage level to the first node after the determination of the first control voltage and the second control voltage.

6. The method of claim 1, wherein applying the first voltage level to the first node comprises applying the first voltage level to the first node after a timer has expired, wherein the timer is started based on at least one of opening the first switch or opening the second switch.

7. The method of claim 1, wherein changing to the second mode is completed upon expiration of a timer that is started based on applying the first voltage level to the first node.

8. The method of claim 1, further comprising:
   determining that a voltage at the first node is within a range of voltages, wherein changing to the second mode is completed based on the determination that the voltage at the first node is within the range of voltages.

9. A power supply circuit comprising:
   a capacitive element for coupling to at least one power terminal of a first amplifier;
   a first switch configured to be closed in a first mode and to be open in a second mode;
   a second switch coupled in series between the first switch and the capacitive element and configured to be closed in the first mode and to be open in the second mode;
   a first circuit coupled to the first switch and configured to charge the capacitive element and power the first amplifier in the first mode; and
   a first buffer circuit having an output coupled to a first node between the first switch and the second switch and configured to output a first voltage level, wherein the first voltage level is:
      less than a sum of a maximum drain-to-source voltage of the second switch and a voltage of the capacitive element after the charging;
      greater than a difference between a second voltage level at a second node between the first circuit and the first switch and a maximum drain-to-source voltage of the first switch;
      greater than a first control voltage for the first switch after opening the first switch; and
      less than a sum of a maximum drain-to-gate voltage of the second switch and a second control voltage for the second switch after opening the second switch.

10. The power supply circuit of claim 9, wherein the first circuit comprises a switched-mode power supply circuit having an inductive element coupled to the first switch.

11. The power supply circuit of claim 10, further comprising a second circuit configured to power the first amplifier in the second mode, the second circuit having a second amplifier with an input coupled to the second node and an output capacitively coupled to the second node, wherein the first mode comprises an average power tracking mode and wherein the second mode comprises an envelope tracking mode.

12. The power supply circuit of claim 11, further comprising a second buffer circuit having an output coupled to a control input of the first switch and configured to apply the first control voltage at a third voltage level less than a maximum gate-to-source voltage of the first switch to open the first switch for the second mode.

13. The power supply circuit of claim 12, further comprising a third buffer circuit having an output coupled to a control input of the second switch and configured to apply the second control voltage at a third voltage level less than a maximum gate-to-source voltage of the second switch.

14. The power supply circuit of claim 9, further comprising a third switch coupled between a control input of the second switch and a ground node and configured to apply a ground voltage to the control input of the second switch to open the second switch for the second mode.

15. The power supply circuit of claim 14, wherein the third switch is configured to apply a ground voltage if a voltage at a third node between the second switch and the capacitive element is less than a threshold voltage.

16. The power supply circuit of claim 9, further comprising:
    at least one comparator configured to determine that the first control voltage for the first switch is less than the second voltage level at the second node and that the second control voltage for the second switch is less than a third voltage level at a third node between the second switch and the capacitive element, wherein the first buffer circuit is configured to output the first voltage level after the determination of the first control voltage and the second control voltage.

17. The power supply circuit of claim 9, wherein the first buffer circuit is configured to output the first voltage level after a delay timer has expired, wherein the delay timer is started based on at least one of opening the first switch or opening the second switch.

18. The power supply circuit of claim 9, further comprising a second circuit coupled to the second node and configured to power the first amplifier in the second mode upon expiration of a delay timer that is started based on outputting the first voltage level at the first node.

19. The power supply circuit of claim 9, further comprising:
    a comparator configured to determine that a voltage at the first node is within a range of voltages; and
    a second circuit coupled to the second node and configured to power the first amplifier in the second mode based on the determination that the voltage at the first node is within the range of voltages.

20. An apparatus for selectively powering an amplifier, comprising:
    means for powering the amplifier in a first mode;
    means for selectively coupling a capacitive element to the means for powering the amplifier in the first mode, the means for selectively coupling comprising a first switch coupled in series with a second switch;
    means for changing to a second mode for powering the amplifier;
    means for controlling the first switch such that the first switch is closed in the first mode and open in the second mode;
    means for controlling the second switch such that the second switch is closed in the first mode and open in the second mode; and
    means for applying a first voltage level to a first node between the first switch and the second switch, wherein the first voltage level is:
       less than a sum of a maximum drain-to-source voltage of the second switch and a voltage of the capacitive element after charging;
       greater than a difference between a second voltage level at a second node between the means for powering the amplifier and the first switch and a maximum drain-to-source voltage of the first switch;
greater than a first control voltage for the first switch after opening the first switch; and
less than a sum of a maximum drain-to-gate voltage of the second switch and a second control voltage for the second switch after opening the second switch.

* * * * *